US009378934B2

(12) United States Patent  
Kuriyama

(10) Patent No.: US 9,378,934 B2  
(45) Date of Patent: Jun. 28, 2016

(54) RACETRACK-SHAPED MAGNETIC-FIELD-GENERATING APPARATUS FOR MAGNETRON SPUTTERING

(75) Inventor: Yoshihiko Kuriyama, Takasaki (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/122,162

(22) PCT Filed: May 28, 2012

(86) PCT No.: PCT/JP2012/063663  
§ 371 (c)(1),  
(2), (4) Date: Nov. 25, 2013

(87) PCT Pub. No.: WO2012/165385  
PCT Pub. Date: Dec. 6, 2012

(65) Prior Publication Data  
US 2014/0085024 A1    Mar. 27, 2014

(30) Foreign Application Priority Data

May 30, 2011   (JP) .................................. 2011-120358  
Jul. 12, 2011   (JP) .................................. 2011-154009

(51) Int. Cl.  
C23C 14/34   (2006.01)  
H01J 37/34   (2006.01)  
H01J 37/32   (2006.01)

(52) U.S. Cl.  
CPC ......... *H01J 37/3405* (2013.01); *H01J 37/3266* (2013.01); *H01J 37/32669* (2013.01); *H01J 37/345* (2013.01); *H01J 37/3408* (2013.01)

(58) Field of Classification Search  
CPC ...................................................... C23C 14/35  
See application file for complete search history.

(56) References Cited

U.S. PATENT DOCUMENTS 4,448,653 A    5/1984 Wegmann  
4,810,346 A *  3/1989 Wolf ................... H01J 37/3405  
                                              204/192.12

(Continued)

FOREIGN PATENT DOCUMENTS

CN    1776006 A    5/2006  
JP    61-147873 A  7/1986

(Continued)

OTHER PUBLICATIONS

Communication dated Jan. 12, 2015 from the State Intellectual Property Office of People's Republic of China in counterpart Application No. 201280025831.3.

(Continued)

*Primary Examiner* — Jason M Berman  
(74) *Attorney, Agent, or Firm* — Sughrue Mion, PLLC

(57) ABSTRACT

A racetrack-shaped magnetic-field-generating apparatus for magnetron sputtering having a linear portion and corner portions, which comprises a center magnetic pole member; a peripheral magnetic pole member surrounding the center magnetic pole member; pluralities of permanent magnets arranged between the center magnetic pole member and the peripheral magnetic pole member to have magnetic poles aligned in one direction; and a non-magnetic base member supporting them; permanent magnets arranged in at least the linear portion being inclined with their surfaces on the side of the center magnetic pole member lower, and with their outside magnetic pole surfaces not in contact with the peripheral magnetic pole member in lower portions; the distance between the center magnetic pole member and the target being the same as the distance between the peripheral magnetic pole member and the target, thereby generating a uniform magnetic field on a target surface.

8 Claims, 17 Drawing Sheets

(56) References Cited

U.S. PATENT DOCUMENTS

| | | | | | |
|---|---|---|---|---|---|
| 5,262,028 | A | * | 11/1993 | Manley | 204/192.12 |
| 6,093,293 | A | * | 7/2000 | Haag et al. | 204/298.12 |
| 6,351,075 | B1 | * | 2/2002 | Barankova et al. | 315/111.71 |
| 2003/0209431 | A1 | | 11/2003 | Brown | |

FOREIGN PATENT DOCUMENTS

| | | |
|---|---|---|
| JP | 64-017861 A | 1/1989 |
| JP | 01-147063 A | 6/1989 |
| JP | 01186671 A1 * | 6/1989 |
| JP | 03-170668 A | 7/1991 |
| JP | 08-134640 A | 5/1996 |
| JP | 08-134641 A | 5/1996 |
| JP | 11-323547 A | 11/1999 |
| JP | 2008-156735 A | 7/2008 |
| JP | 2008-156743 A | 7/2008 |
| JP | 2009-108383 A | 5/2009 |
| JP | 2009-127109 A | 6/2009 |
| KR | 1020050053605 A | 6/2005 |

OTHER PUBLICATIONS

Communication dated Apr. 20, 2015, issued by the Korean Intellectual Property Office in counterpart Application No. 10-2013-7031145.

* cited by examiner

RACETRACK-SHAPED MAGNETIC-FIELD-GENERATING APPARATUS FOR MAGNETRON SPUTTERING

CROSS REFERENCE TO RELATED APPLICATIONS

This is a National Stage of International Application No. PCT/JP2012/063663, filed May 28, 2012 (claiming priority form Japanese Patent Application Nos. 2011-120358, filed May 30, 2011, and 2011-154009, filed Jul. 12, 2011), the contents of which are incorporated herein by reference in their entirety.

FIELD OF THE INVENTION

The present invention relates to a magnetic-field-generating apparatus assembled in a racetrack-shaped magnetron sputtering apparatus for forming a thin film on a substrate surface.

BACKGROUND OF THE INVENTION

A phenomenon that atoms or molecules are ejected from a target by a high-speed bombardment of an inert substance such as Ar, etc. is called "sputtering." The ejected atoms or molecules can be accumulated on a substrate to form a thin film. A magnetron sputtering method uses a magnetic field in a cathode to increase a speed of accumulating a target material on a substrate, and can form a film at low temperatures because electrons do not impinge on substrates. Accordingly, the magnetron sputtering method is widely used to produce electronic parts such as semiconductor ICs, flat panel displays, solar cells, etc., and to form thin films such as reflection films, etc. on substrate surfaces.

A magnetron sputtering apparatus comprises a substrate on the anode side, a target (cathode) arranged to oppose the substrate, and a magnetic-field-generating apparatus arranged below the target, in a vacuum chamber. With voltage applied between the anode and the cathode to cause glow discharge for ionizing an inert gas (Ar at about 0.1 Pa, etc.) in the vacuum chamber, secondary electrons discharged from the target are captured by a magnetic field generated by the magnetic-field-generating apparatus, causing a cyclotron motion on a target surface. Because the cyclotron motion of electrons accelerates the ionization of gas molecules, a film-forming speed is dramatically higher than when a magnetic field is not used, resulting in strong adhesion of a film.

As shown in FIG. 21, a magnetic circuit apparatus 150 used in a magnetron sputtering apparatus comprises a plate- or rod-shaped, center magnet 160 magnetized in a height direction (perpendicular to a target surface), a peripheral rectangular magnet 170 magnetized in an opposite direction to the center magnet 160 and arranged around the center magnet 160, and a yoke 180 supporting the center magnet 160 and the peripheral magnet 170, to generate a magnetic field in a racetrack form on a target surface (for example, see JP 8-134640 A). With a racetrack-shaped magnetic circuit, secondary electrons can be contained in a closed space, resulting in a high sputtering efficiency. To form a closed space for containing secondary electrons, a magnetic field of 10 mT or more as a horizontal component of a magnetic flux density is usually needed.

The erosion of a target is fastest in a portion shown by a broken line 190 in FIG. 22, in which a vertical component of a magnetic flux density is zero in the magnetic circuit. Accordingly, the magnetic field on a target surface should be adjusted, such that erosion in a portion in which a magnetic flux density has no vertical component, which is simply called "vertical-component-free magnetic flux density portion," is as close to erosion in other portions as possible. However, because the distance of a vertical-component-free magnetic flux density portion 190 from the center magnet 160 is larger in the linear portion of the magnetic circuit (distance R) than in the corner portions (distance r) (r<R), in the magnetic circuit apparatus 150 as shown in FIG. 21, magnetic flux is concentrated in the vertical-component-free magnetic flux density portion in the corner portions. As a result, plasma is concentrated in the corner portions, resulting in the fastest erosion in the corner portions. Though JP 8-134640 A discloses a technology of arranging magnets in a T form in the corner portions to eliminate the unevenness of a vertical magnetic flux density in the corner portions, its improvement is not sufficient.

JP 2008-156735 A discloses, as shown in FIG. 23(a) and FIG. 23(b), a magnetic-field-generating apparatus 200 for magnetron sputtering, which comprises a non-magnetic base 210, a rod-shaped center magnetic pole piece 220 disposed on the non-magnetic base 210, a peripheral racetrack-shaped magnetic pole piece 230 disposed around the center magnetic pole piece 220, and plural permanent magnets 240, 250 arranged between the center magnetic pole piece 220 and the peripheral magnetic pole piece 230, the permanent magnets 240, 250 being magnetized in a horizontal direction and arranged with their magnetic poles of the same polarity opposing the center magnetic pole piece 220, and the center magnetic pole piece 220 and the peripheral magnetic pole piece 230 being higher than the permanent magnets 240, 250. Because magnetic pole surfaces of the permanent magnets 240, 250 are in contact with the magnetic pole pieces 220, 230 in this magnetic-field-generating apparatus, the leakage of magnetic flux from the permanent magnets 240, 250 is reduced, resulting in a larger region than ever, in which a magnetic field intensity (having a horizontal magnetic flux density of 10 mT or more) necessary for containing a plasma-excited inert gas with a smaller number of permanent magnets is obtained. As a result, the erosion region of a target is expanded, resulting in more uniform erosion in the linear and corner portions of the magnetic circuit.

Though the erosion region of a target in corner portions is wider in the magnetic-field-generating apparatus of JP 2008-156735 A than in that of JP 8-134640 A, there is less erosion near the center magnetic pole piece 220 because the deepest erosion portion in the linear portion is close to the peripheral magnetic pole piece 230. Thus, it has been found that an erosion region should also be expanded in a center portion of the magnetic-field-generating apparatus.

JP 1-147063 A discloses, as shown in FIGS. 26(a) and 26(b), a circular magnetic-field-generating apparatus for magnetron sputtering, which comprises concentric magnetic shunt plates 311a, 311b, 311c above a magnetic circuit comprising concentric magnets 302a, 302b, 303. A portion having a strong horizontal magnetic field is expanded and made more uniform by the magnetic shunt plates 311a, 311b, 311c, resulting in more uniform erosion of the target. However, the shunt plates cannot sufficiently expand a magnetic flux density distribution near the center magnetic pole piece in a magnetic-field-generating apparatus for magnetron sputtering with the magnetization direction of magnets in parallel to the target as described in JP 2008-156735 A, though the shunt plates are effective for a magnetic-field-generating apparatus for magnetron sputtering with the magnetization direction of magnets perpendicular to the target.

JP 2009-108383 A discloses, as shown in FIG. 27, a target apparatus for magnetron sputtering using a cylindrical or planar target, which comprises a magnet unit comprising magnets 324b, 324c arranged in a zigzag manner on a support member 324a to generate a magnetic field inclined relative to the longitudinal direction of the target. However, it is difficult to produce this magnet unit because of the complicated arrangement of magnets 324b, 324c.

OBJECT OF THE INVENTION

Accordingly, an object of the present invention is to provide a racetrack-shaped magnetic-field-generating apparatus for magnetron sputtering, which has an expanded erosion region even in its center portion, thereby providing uniform erosion of a target.

SUMMARY OF THE INVENTION

As a result of intensive research in view of the above objects, the inventor has found that in a racetrack-shaped magnetic-field-generating apparatus for magnetron sputtering, which comprises pluralities of permanent magnets magnetized in a horizontal direction in a racetrack-shaped region formed by a center magnetic pole member and a peripheral magnetic pole member, the erosion region can be expanded in its center portion by (a) inclining the permanent magnets such that their magnetic pole surfaces opposing the center magnetic pole member are more distant from the target, (b) arranging the permanent magnets having magnetization directions opposing the target on the center magnetic pole member, or (c) making the distance between the center magnetic pole member and the target surface smaller than the distance between the peripheral magnetic pole member and the target surface. The present invention has been completed based on such findings.

Thus, the first racetrack-shaped magnetic-field-generating apparatus of the present invention for generating a magnetic field on a target surface for magnetron sputtering comprises
a center magnetic pole member;
a peripheral magnetic pole member surrounding the center magnetic pole member;
pluralities of permanent magnets arranged between the center magnetic pole member and the peripheral magnetic pole member with one magnetic pole opposing the center magnetic pole member and the other magnetic pole opposing the peripheral magnetic pole member; and
a non-magnetic base member supporting the center magnetic pole member, the peripheral magnetic pole member and the permanent magnets;
the racetrack shape having a linear portion and corner portions;
each permanent magnet arranged at least in the linear portion having a magnetic pole surface opposing the center magnetic pole member, which has a magnetization direction inclined away from the target;
each permanent magnet arranged at least in the linear portion having a magnetic pole surface opposing the peripheral magnetic pole member, which has a portion not in contact with the peripheral magnetic pole member on a closer side to the base member; and
the distance between the center magnetic pole member and the target being the same as the distance between the peripheral magnetic pole member and the target.

In the first magnetic-field-generating apparatus for magnetron sputtering, the inclination angle of the permanent magnets arranged in the linear portion is preferably 5-45° relative to the target.

In the first magnetic-field-generating apparatus for magnetron sputtering, pluralities of permanent magnets arranged in the linear portion may be constituted by at least two groups of permanent magnets having different inclination angles.

In the first magnetic-field-generating apparatus for magnetron sputtering, the permanent magnets arranged in the corner portions are magnetized preferably in parallel to the target.

In the first magnetic-field-generating apparatus for magnetron sputtering, it is preferable that each permanent magnet arranged in the corner portions has a magnetic pole surface opposing the center magnetic pole member, which has a magnetization direction inclined away from the target; and that each permanent magnet arranged in the corner portions has a magnetic pole surface opposing the peripheral magnetic pole member, which has a portion not in contact with the peripheral magnetic pole member on a closer side to the base member.

In the first magnetic-field-generating apparatus for magnetron sputtering, the surfaces of the center magnetic pole member and the peripheral magnetic pole member, which are opposing the target, are preferably in parallel to the target.

The second racetrack-shaped magnetic-field-generating apparatus of the present invention for generating a magnetic field on a target surface for magnetron sputtering comprises
a center magnetic pole member;
a peripheral magnetic pole member surrounding the center magnetic pole member;
pluralities of first permanent magnets each having a magnetization direction in parallel to the target surface, and arranged between the center magnetic pole member and the peripheral magnetic pole member with one magnetic pole opposing the center magnetic pole member and the other magnetic pole opposing the peripheral magnetic pole member; and
a non-magnetic base member supporting the center magnetic pole member, the peripheral magnetic pole member and the permanent magnets;
second permanent magnets each having a magnetization direction perpendicular to the target surface being arranged on the center magnetic pole member, such that their magnetic poles opposing the target surface are the same as those of the first permanent magnets opposing the center magnetic pole member.

In the second magnetic-field-generating apparatus for magnetron sputtering, it is preferable that the center magnetic pole member extends in the racetrack-shaped linear portion and the corner portions; and that among the second permanent magnets arranged on the center magnetic pole member, those in the linear portion are thinner than those in both end portions of the center magnetic pole member.

The third racetrack-shaped magnetic-field-generating apparatus of the present invention for generating a magnetic field on a target surface for magnetron sputtering comprises
a center magnetic pole member;
a peripheral magnetic pole member surrounding the center magnetic pole member;
pluralities of permanent magnets each having a magnetization direction in parallel to the target surface, and arranged between the center magnetic pole member and the peripheral magnetic pole member with one magnetic pole opposing the center magnetic pole member and the other magnetic pole opposing the peripheral magnetic pole member; and a non-magnetic base member supporting the center magnetic pole member, the peripheral magnetic pole member and the permanent magnets;

the distance between the center magnetic pole member and the target surface being smaller than the distance between the peripheral magnetic pole member and the target surface.

DESCRIPTION OF THE PREFERRED EMBODIMENTS

Figure 1A:
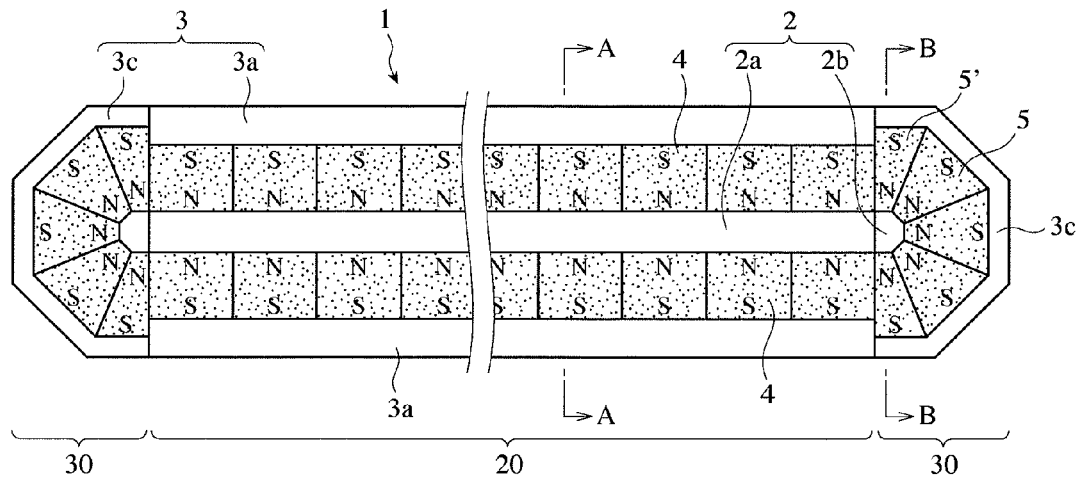
FIG. 1(a) is a plan view showing an example of the first racetrack-shaped magnetic-field-generating apparatuses for magnetron sputtering according to the present invention.
Figure 1B:
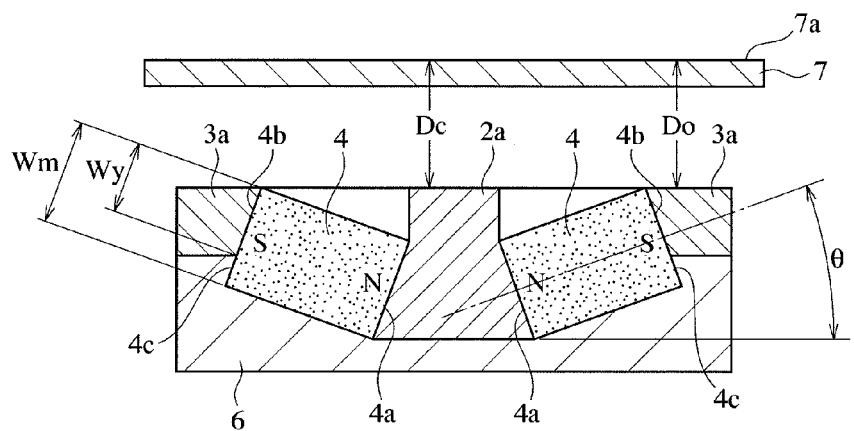
FIG. 1(b) is a cross-sectional view taken along the line A-A in FIG. 1(a).
Figure 1C:
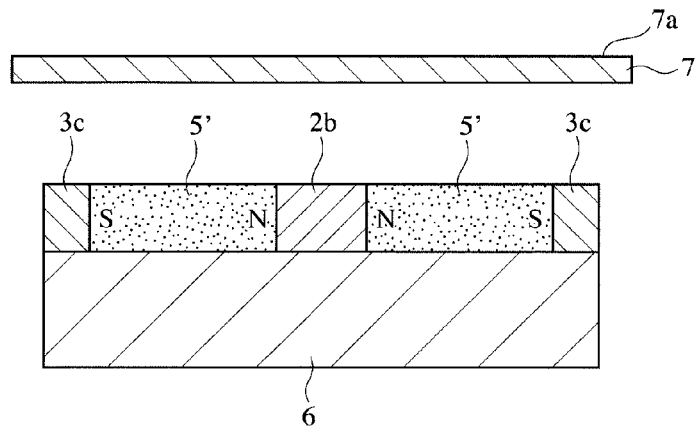
FIG. 1(c) is a cross-sectional view taken along the line B-B in FIG. 1(a).
Figure 1D:
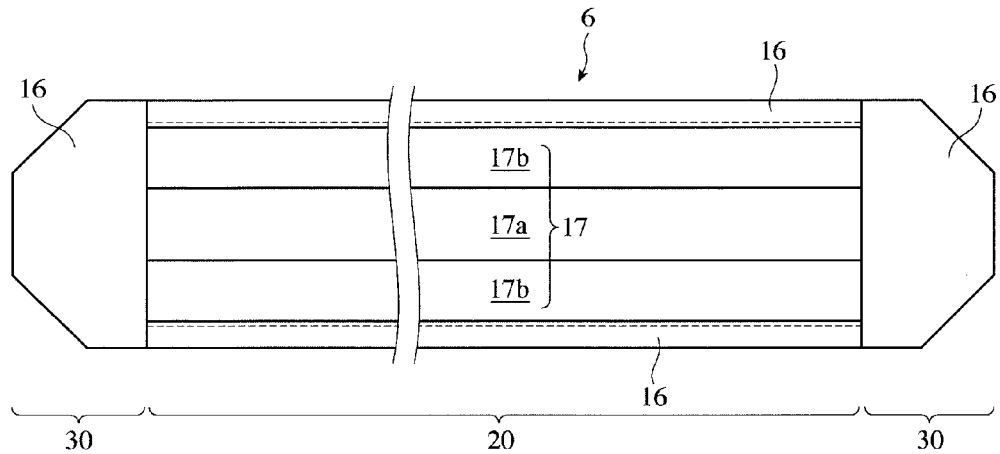
FIG. 1(d) is a plan view showing a non-magnetic base member constituting the magnetic-field-generating apparatus of FIG. 1(a).
Figure 1E:
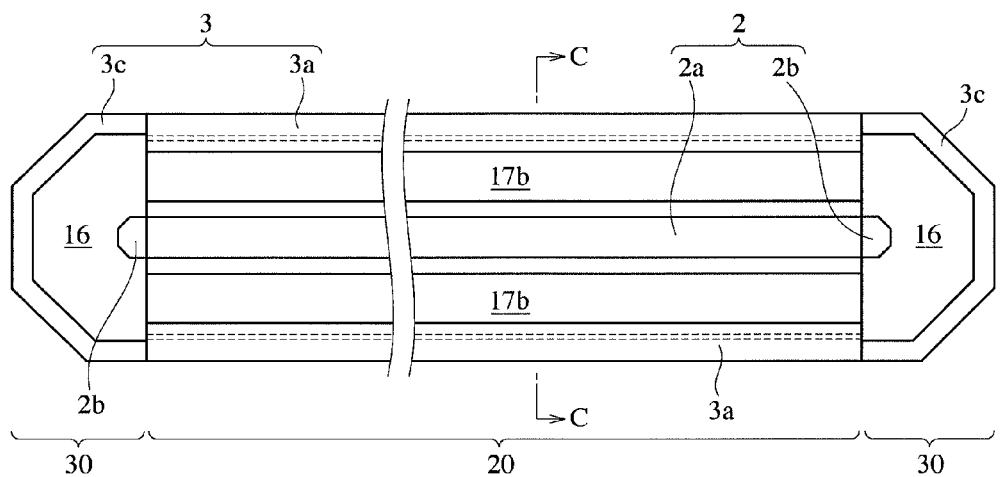
FIG. 1(e) is a plan view showing a non-magnetic base member, a center magnetic pole member and a peripheral magnetic pole member constituting the magnetic-field-generating apparatus of FIG. 1(a).
Figure 1F:
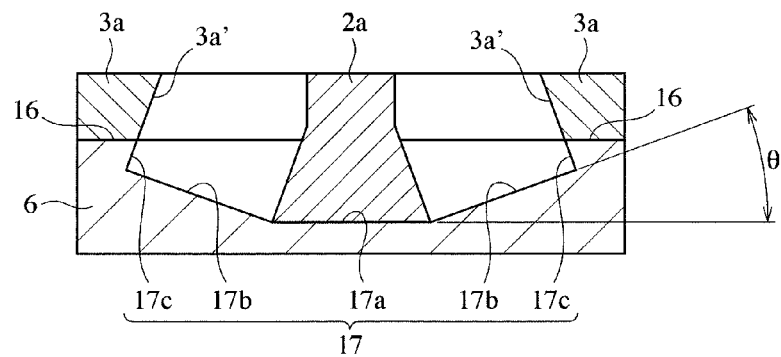
FIG. 1(f) is a cross-sectional view taken along the line C-C in FIG. 1(e).

The embodiments of the present invention will be explained in detail below referring to the attached drawings. Explanations on one embodiment are applicable to other embodiments unless otherwise mentioned. Also, the depicted examples are not restrictive, but may be subject to various modifications within the scope of the present invention.

[1] First racetrack-shaped magnetic-field-generating apparatus for magnetron sputtering As shown in FIGS. 1(*a*)-1(*c*), the first magnetic-field-generating apparatus 1 for magnetron sputtering, which generates a magnetic field in a racetrack form on a target surface, has a racetrack shape comprising a linear portion 20 and two corner portions 30, 30. The first magnetic-field-generating apparatus 1 comprises, on a non-magnetic base member 6, a rod-shaped, center magnetic pole member 2, a racetrack-shaped, peripheral magnetic pole member 3 surrounding the center magnetic pole member 2, and pluralities of permanent magnets 4, 5 arranged between the center magnetic pole member 2 and the peripheral magnetic pole member 3.

Both of the center magnetic pole member 2 and the peripheral magnetic pole member 3 are preferably made of soft-magnetic materials such as soft-magnetic steel, etc. Materials for the permanent magnets 4, 5 may be properly determined depending on the apparatus structure (distance from the magnetic-field-generating apparatus to the target) and a necessary magnetic field intensity. To obtain a high magnetic flux density, rare earth magnets such as anisotropic sintered R-T-B magnets comprising as indispensable components R (at least one of rare earth elements such as Nd, etc.), T (Fe or Fe and Co) and B, etc. may be used. When a high magnetic flux density is not needed, ferrite magnets may be used. To have different magnetic flux densities in the linear portion and the corner portions, materials and sizes of their magnets may be designed depending on necessary magnetic flux densities.

(1) Non-Magnetic Base Member

As shown in FIGS. 1(*d*) and 1(*f*), the non-magnetic base member 6 has a first upper surface 16 in both edge portions of the linear portion 20 and the corner portions 30, 30, and a groove 17 extending in the linear portion 20 between the first upper surfaces 16. The groove 17 has a second upper surface 17*a* extending in the center, first inclined surfaces 17*b*, 17*b* extending on both sides of the second upper surface 17*a*, and second inclined surfaces 17*c* each having a hangover shape and extending from an outer edge of each first inclined surface 17*b* to the first upper surface 16. Each corner portion 30, 30 has a polygonal shape when viewed from above in the depicted example, though not restrictive. Each first inclined surface 17*b*, 17*b* is inclined with the outside (the side of the peripheral magnetic pole member 3) higher. The inclination angle θ of each first inclined surface 17*b*, 17*b* from the upper surface (first upper surface 16) of the non-magnetic base member 6 is preferably in a range of 5-45° as described later.

(2) Center Magnetic Pole Member

As shown in FIGS. 1(*b*)-1(*f*), the center magnetic pole member 2 has a cross section, which is trapezoidal in a lower portion and rectangular in an upper portion, comprising a first center magnetic pole portion 2*a* having a rod shape and disposed on the second upper surface 17*a* in the linear portion 20, and second center magnetic pole portions 2*b* each having a polygonal shape when viewed from above, which are connected to both ends of the first center magnetic pole portion 2*a* and disposed on the first upper surface 16 in the corner portions 30, 30. The second center magnetic pole portions 2*b* may be integral with or separate from the first center magnetic pole portion 2*a*. The center magnetic pole member 2 preferably has an upper surface in parallel to the target surface 7*a*.

(3) Peripheral Magnetic Pole Member

As shown in FIGS. 1(*c*)-1(*f*), the peripheral magnetic pole member 3 disposed on the first upper surface 16 of the non-magnetic base member 6 comprises first peripheral magnetic pole portions 3*a* each having an inversed trapezoidal cross section and arranged in the linear portion 20, and second peripheral magnetic pole portions 3*c* each having a rectangular cross section and arranged in an edge portion of the first upper surface 16 in each corner portion 30, 30. An inclined inside surface 3*a*' of each first peripheral magnetic pole portion 3*a* is in alignment with each second inclined surface 17*c* of the non-magnetic base member 6. The peripheral magnetic pole member 3 preferably has an upper surface in parallel to the target surface 7*a*.

Each second peripheral magnetic pole portion 3*c* of the peripheral magnetic pole member 3 has a semicircular or semi-polygonal shape, depending on whether each corner portion 30 of the non-magnetic base member 6 has a semicircular or semi-polygonal shape with a center at the second center magnetic pole portion 2*b* of the center magnetic pole member 2. The shape of each permanent magnet 5 in each corner portion is determined by on the shape of each second peripheral magnetic pole portion 3*c*.

The first center magnetic pole portion 2*a* disposed on the second upper surface 17*a* in the linear portion 20, the second center magnetic pole portions 2*b* disposed on the first upper surface 16 in the corner portions 30, 30, the first peripheral magnetic pole portion 3*a* disposed on the first upper surface 16 in the linear portion 20, and the second peripheral magnetic pole portions 3*c* disposed on edge portions of the first upper surface 16 in the corner portions 30, 30 preferably have the same height. Accordingly, as shown in FIG. 1(*b*), the distance Dc between the upper surface of the center magnetic pole member 2 and the target surface 7*a* is preferably equal to the distance Do between the upper surface of the peripheral magnetic pole member 3 and the target surface 7*a*.

(4) Permanent Magnet

As shown in FIG. 1(*a*), each of permanent magnets 4 arranged in the linear portion 20 and permanent magnets 5 arranged in the corner portions 30, 30 has one magnetic pole opposing the center magnetic pole member 2, and the other magnetic pole opposing the peripheral magnetic pole member 3.

As shown in FIG. 1(*b*), pluralities of permanent magnets 4 in the linear portion 20 have magnetization directions inclined relative to the target surface 7*a* by an angle θ, such that the magnetic pole surfaces 4*a* opposing the center magnetic pole member 2 are more distant from the target surface 7*a*. As a result, the distance between the magnetic pole surface 4*a* on the side of the center magnetic pole member 2 and the target surface 7*a* is larger than the distance between the magnetic pole surface 4*b* on the side of the peripheral magnetic pole member 3 and the target surface 7*a*. Because all permanent magnets 4 have rectangular cross sections, and are magnetized to have magnetic poles on the opposing surfaces in the depicted example, all permanent magnets 4 have an inclination angle θ. The permanent magnets 4 arranged on both sides of the center magnetic pole member 2 preferably have magnetization directions with the same inclination angle θ. The inclination angle θ of the magnetization direction of the permanent magnet 4 relative to the target surface 7a is preferably in a range of 5-45°. The inclination angle θ of less than 5° provides substantially no effect of shifting a portion in which a magnetic flux density has no vertical component on the target surface 7a, which may be called simply "vertical-component-free magnetic flux density portion," toward a center portion of the magnetic-field-generating apparatus 1. On the other hand, the inclination angle θ exceeding 45° is unlikely to provide a sufficient magnetic flux density on the target surface 7a. The inclination angle θ is more preferably in a range of 10-20°, though variable depending on the type of the target, etc.

When the permanent magnet 4 is in the form of a rectangular parallelepiped as shown in FIG. 1(*b*), the inclination angle θ of the permanent magnet 4 makes the first center magnetic pole portion 2a of the center magnetic pole member 2 have a lower side surface inclined by an angle of (90°-θ), and the first peripheral magnetic pole portion 3a of the peripheral magnetic pole member 3 have an inner side surface 3a' inclined by an angle of (90°-θ). An outer end surface 4b of each permanent magnet 4 opposing the peripheral magnetic pole member 3 has a lower portion 4c closer to the base member 6, which is not in contact with the peripheral magnetic pole member 3. The width $W_m$ of the outer end surface 4b of the permanent magnet 4 is larger than the width $W_y$ of the inner side surface 3a' (opposing the permanent magnet 4) of the peripheral magnetic pole member 3. The contact-free portion 4c of the permanent magnet 4 preferably has a width of ($W_m-W_y$). $W_m$ and $W_y$ preferably meet the condition of $W_y=\alpha \times W_m$, wherein α is a coefficient of 0.4-0.6. The portion 4c of the permanent magnet 4, which is not in contact with the peripheral magnetic pole member 3, functions as a magnetic gap between the permanent magnet 4 and the peripheral magnetic pole member 3.

As described above, because the permanent magnets 4 are inclined with their outer end surfaces 4b having lower portions 4c not in contact with the peripheral magnetic pole member 3, a magnetic path formed by the permanent magnets 4 on the side of the target 7 has smaller magnetic resistance than that of a magnetic path on the side of the base member 6. As a result, a vertical-component-free magnetic flux density portion on the target surface 7a is shifted toward the center magnetic pole member 2, so that the erosion region of the target 7 is expanded toward a center portion of the magnetic-field-generating apparatus 1. With the inclination angle θ of the permanent magnets 4, the intensity of a magnetic field on the target surface 7a can be adjusted.

Figure 2A:
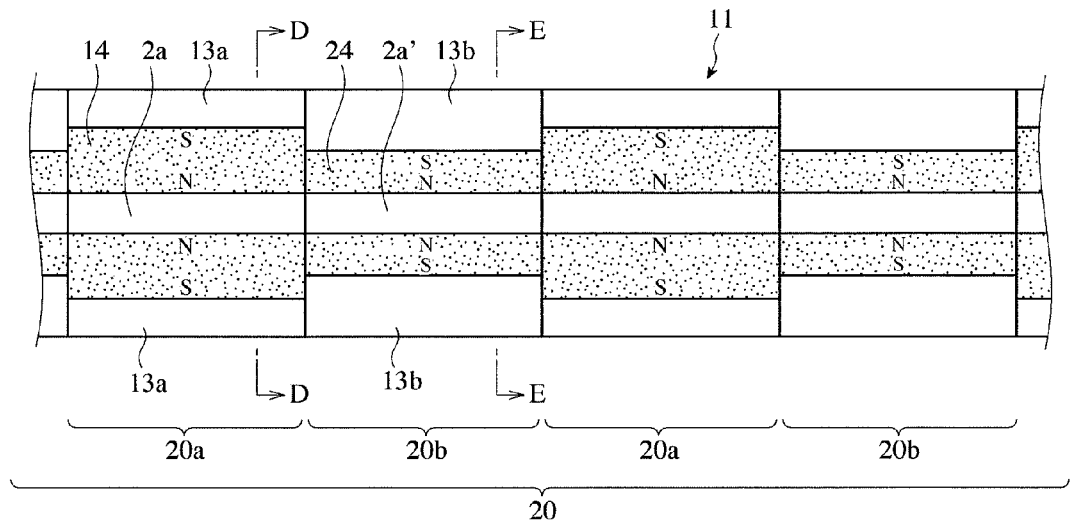
FIG. 2(a) is a partial plan view showing another example of the first racetrack-shaped magnetic-field-generating apparatuses for magnetron sputtering according to the present invention.
Figure 2B:
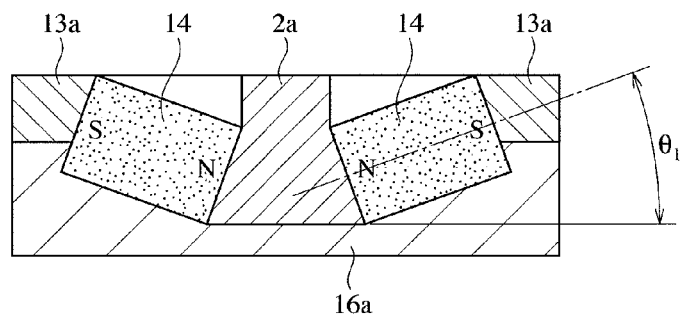
FIG. 2(b) is a cross-sectional view taken along the line D-D in FIG. 2(a).
Figure 2C:
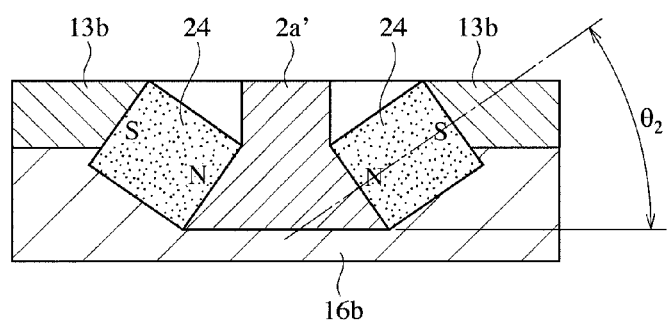
FIG. 2(c) is a cross-sectional view taken along the line E-E in FIG. 2(a).

Though all permanent magnets 4 arranged in the linear portion 20 have the same inclination angle θ in the magnetic-field-generating apparatus 1 shown in FIGS. 1(*a*)-1(*c*), at least two groups of permanent magnets with different inclination angles may be used. In the magnetic-field-generating apparatus 11 shown in FIGS. 2(*a*)-2(*c*), regions 20a comprising permanent magnets 14 inclined by an angle $\theta_1$, and regions 20b comprising permanent magnets 24 inclined by an angle $\theta_2$, which differs from the angle $\theta_1$, are alternately arranged. With pluralities of permanent magnets 14, 24 having different inclination angles, the position of the deepest erosion portion can be shifted to improve the use efficiency of the target 7. When at least two groups of permanent magnets with different inclination angles are used, the entire magnetic-field-generating apparatus may be swung vertically and/or laterally during sputtering.

Though the magnetization directions of the permanent magnets 5 are in parallel to the target surface 7a in the corner portions in the example shown in FIG. 1(*c*), the magnetization directions may be inclined, such that (a) the magnetic pole surfaces of the permanent magnets 5 opposing the second center magnetic pole portion 2b of the center magnetic pole member 2 are more distant from the target surface 7a, and (b) their lower surface portions (closer to the base member 6) opposing the second peripheral magnetic pole portion 3c are not in contact with the second peripheral magnetic pole portion 3c, to adjust the erosion region and the intensity of a magnetic field in the corner portions. When the permanent magnets 5 are inclined relative to the target surface 7a, the permanent magnets 4 in the linear portion 20 may have the same or different inclination angles.

Figure 4:
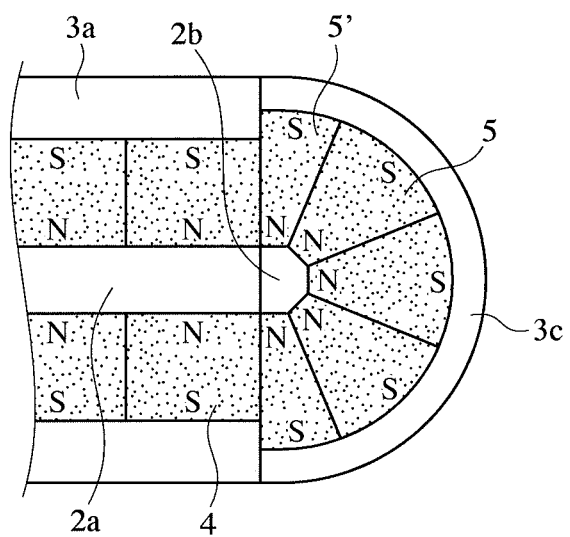
FIG. 4 is a partial plan view showing a further example of corner portions in the first racetrack-shaped magnetic-field-generating apparatus of the present invention.
Figure 5:
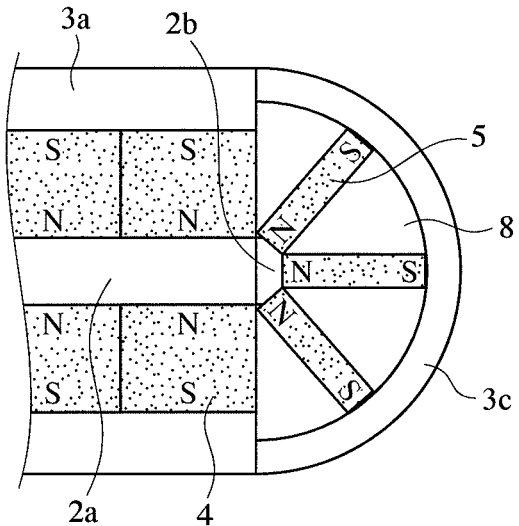
FIG. 5 is a partial plan view showing a still further example of corner portions in the first racetrack-shaped magnetic-field-generating apparatus of the present invention.

Though the permanent magnets 5 in the corner portions 30 are substantially trapezoidal when viewed from above in the example shown in FIGS. 1(*a*) and 3, they are preferably substantially fan-shaped when viewed from above as shown in FIG. 4 when the second peripheral magnetic pole portions 3c are semicircular in the corner portions 30. Also, the permanent magnets 5 in the corner portions 30 may be rectangular when viewed from above, as shown in FIG. 5. The number and size of the permanent magnets 5 in the corner portions 30 are not particularly restricted, but they may be divided to any size or different sizes from the aspect of easiness of production and assembling.

Figure 3:
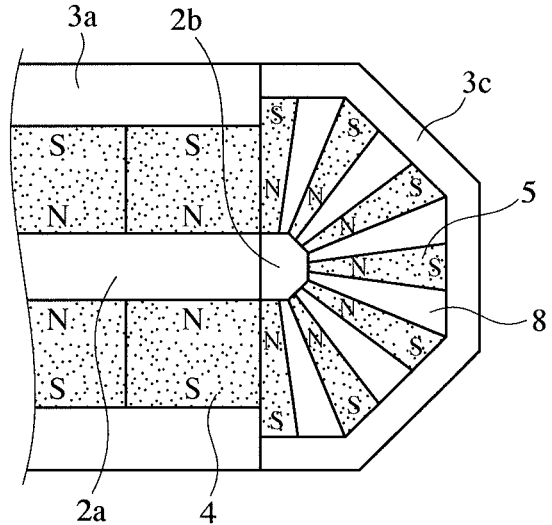
FIG. 3 is a partial plan view showing another example of corner portions in the first racetrack-shaped magnetic-field-generating apparatus of the present invention.

The permanent magnets 5 may be arranged in each corner portion 30, such that they completely occupy a space between the second center magnetic pole portion 2b of the center magnetic pole member 2 and the second peripheral magnetic pole portion 3c of the peripheral magnetic pole member 3 as shown in FIG. 1(*a*), or such that there is a gap 8 between adjacent permanent magnets 5 as shown in FIG. 3. When the permanent magnets 5 are arranged with gaps 8 in each corner portion, a magnetic flux density on the target surface can be adjusted by the gaps 8. Each gap 8 may be filled with a non-magnetic spacer. A ratio of an area occupied by the permanent magnets 5 to the area of a space between the second center magnetic pole portion 2b of the center magnetic pole member 2 and the second peripheral magnetic pole portion 3c of the peripheral magnetic pole member 3 is preferably 30% or more.

(5) Erosion Region

Figure 25:
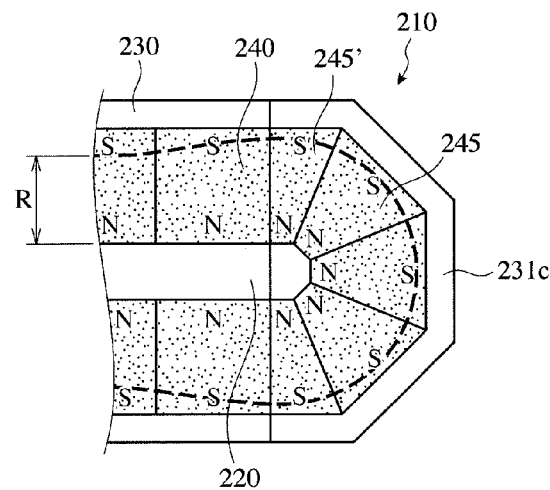
FIG. 25 is a partial schematic view showing a portion in which a magnetic field generated by the conventional magnetic-field-generating apparatus for magnetron sputtering shown in FIG. 24 has a magnetic flux density with no vertical component on a target surface.
Figure 26A:
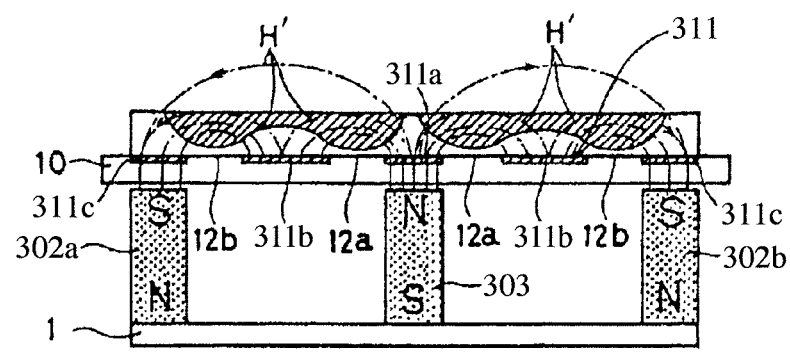
FIG. 26(a) is a cross-sectional view showing the circular magnetic-field-generating apparatus for magnetron sputtering disclosed by JP 1-147063 A.
Figure 26B:
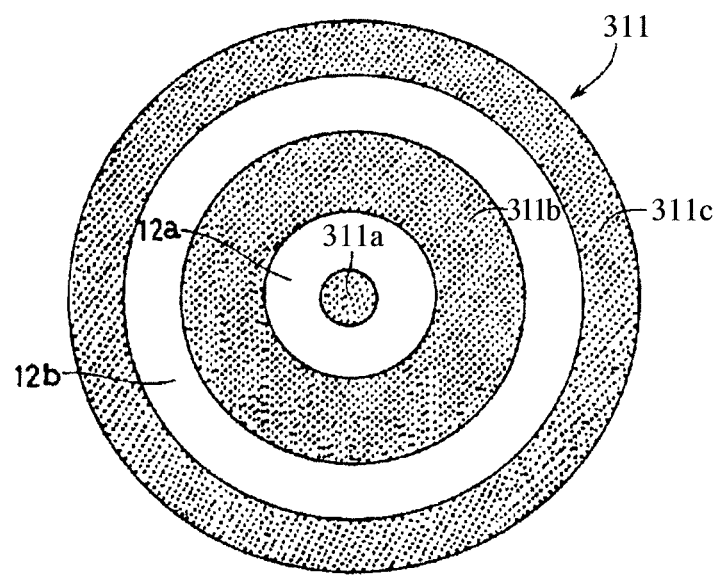
FIG. 26(*b*) is a plan view showing the arrangement of shunt plates in the circular magnetic-field-generating apparatus for magnetron sputtering shown in FIG. 26(*a*).
Figure 27:
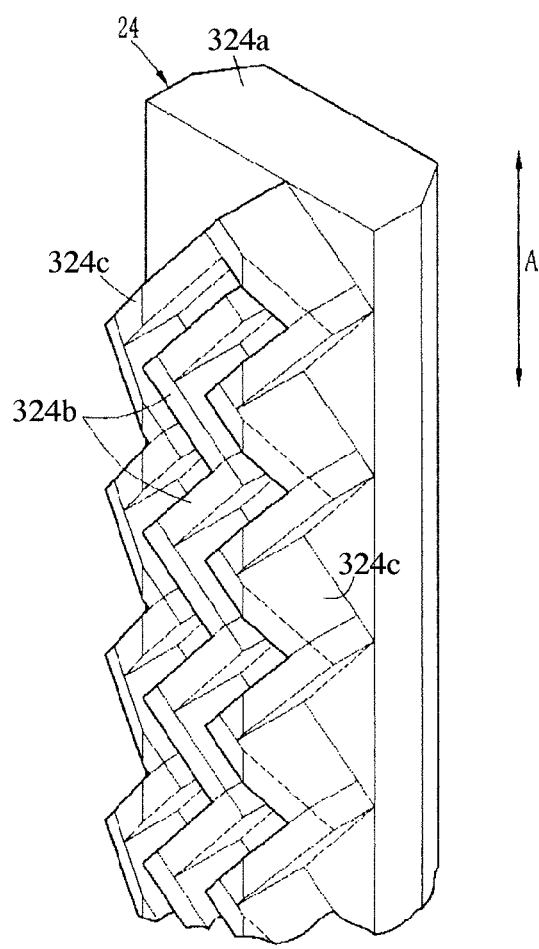
FIG. 27 is a perspective view showing the arrangement of permanent magnets in the magnetron sputtering target apparatus disclosed by JP 2009-108383 A.

In a conventional magnetic-field-generating apparatus comprising permanent magnets 4 in parallel to the target surface 7a in the linear portion 20, a portion in which a magnetic flux density has no vertical component exists along a line (shown by a broken line with a distance R from the center magnetic pole member 2 in FIG. 25) when viewed from above on the target surface. Because the erosion of the target proceeds fastest in a portion in which a magnetic flux density has no vertical component, the shifting of this portion away from the center magnetic pole member 2 makes the erosion of a center portion of the target slower, resulting in uneven erosion of the target, and thus lower use efficiency of the target.

Figure 6:
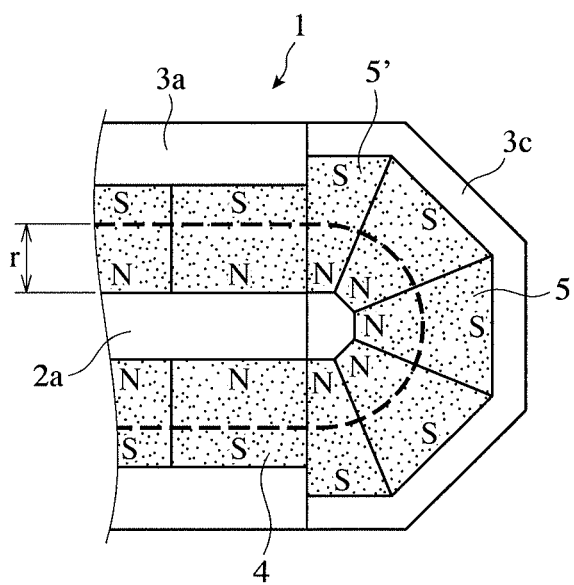
FIG. 6 is a partial schematic view showing a portion in which a magnetic field generated by the first racetrack-shaped magnetic-field-generating apparatus of the present invention has a magnetic flux density with no vertical component on a target surface.

In the magnetic-field-generating apparatus 1 of the present invention comprising permanent magnets 4 inclined relative to the target surface 7a in the linear portion 20, on the other hand, a portion in which a magnetic flux density has no vertical component (shown by a broken line) exists with a distance r (r<R) from the center magnetic pole member 2 in the linear portion 20 as shown in FIG. 6. Accordingly, the deepest erosion portion is shifted toward a center of the target, resulting in more uniform erosion of the target, and thus higher use efficiency of the target. A horizontal component of a magnetic flux density is largest near the portion in which a magnetic flux density has no vertical component. Accordingly, the horizontal component of a magnetic flux density is preferably 10 mT or more in the portion in which a magnetic flux density has no vertical component on the target surface 7a.

[2] Second racetrack-shaped magnetic-field-generating apparatus for magnetron sputtering The second magnetic-field-generating apparatus 101 for magnetron sputtering comprises (a) a center magnetic pole member 102, (b) a peripheral magnetic pole member 103 surrounding the center magnetic pole member 102, (c) pluralities of permanent magnets 104, 105 each having a magnetization direction in parallel to a target surface, and arranged between the center magnetic pole member 102 and the peripheral magnetic pole member 103, with one magnetic pole opposing the center magnetic pole member 102 and the other magnetic pole opposing the peripheral magnetic pole member 103, and (d) a non-magnetic base member 106 supporting the center magnetic pole member 102, the peripheral magnetic pole member 103 and the permanent magnets 104, 105, (e-1) permanent magnets 104a, 105a having magnetization directions perpendicular to the target surface being arranged on the center magnetic pole member 102, such that their magnetic poles opposing the target surface are the same as the magnetic poles of the permanent magnets 104, 105 on the side of the center magnetic pole member 102, or (e-2) the distance between the center magnetic pole member 102 and the target surface being smaller than the distance between the peripheral magnetic pole member 103 and the target surface, so that a higher magnetic flux density exists on the center magnetic pole member 102 on the side of the target. With such structure, a center portion of the target opposing the center magnetic pole member 102 has an increased erosion speed, resulting in improved use efficiency of the target. With respect to the first embodiment (e-1) and the second embodiment (e-2), their differences from the first magnetic-field-generating apparatus 1 for magnetron sputtering will be explained in detail. Accordingly, with respect to those not explained, please refer to explanations on the first magnetic-field-generating apparatus 1 for magnetron sputtering.

(1) First Embodiment

Figure 9A:
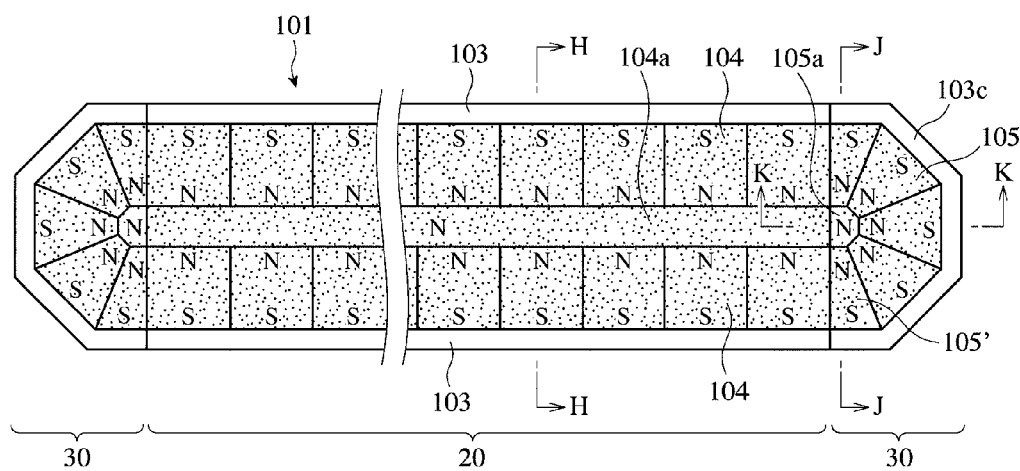
FIG. 9(a) is a plan view showing the second racetrack-shaped magnetic-field-generating apparatus for magnetron sputtering according to the present invention.
Figure 9B:
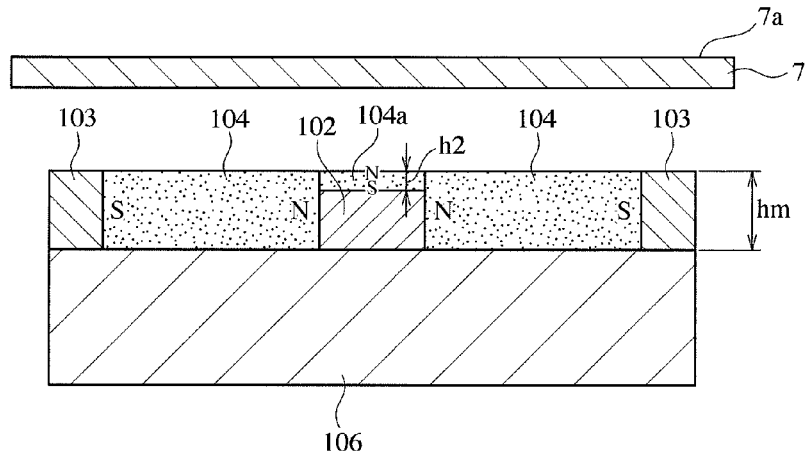
FIG. 9(b) is a cross-sectional view taken along the line H-H in FIG. 9(a).

As shown in FIGS. 9(a) and 9(b), the second magnetic-field-generating apparatus 101 for magnetron sputtering according to the first embodiment comprises, on a non-magnetic base member 106 having a flat upper surface, (a) a rod-shaped, center magnetic pole member 102; (b) a peripheral magnetic pole member 103 surrounding the center magnetic pole member 102; (c) pluralities of permanent magnets 104 and 105 each having a magnetization direction in parallel to the target surface 7a, and arranged between the center magnetic pole member 102 and the peripheral magnetic pole member 103, with one magnetic pole opposing the center magnetic pole member 102 and the other magnetic pole opposing the peripheral magnetic pole member 103; and (d) permanent magnets 104a, 105a each having a magnetization direction perpendicular to the target surface 7a, which are disposed on the center magnetic pole member 102 and its end portions 102a, such that their magnetic poles opposing the target surface 7a are the same as those of the permanent magnets 104, 105 on the side of the center magnetic pole member 102. In the depicted second magnetic-field-generating apparatus 101, the non-magnetic base member 106 has a flat upper surface, and both longitudinal end portions 102a, 102a of the center magnetic pole member 102 are thin.

The permanent magnets 104a on the center magnetic pole member 102 may be integral or constituted by pluralities of longitudinally arranged permanent magnets. Longitudinal gaps may be provided between plural permanent magnets 104a, if necessary. Though properly adjustable depending on a necessary magnetic field intensity and a magnet material, the thickness [h2 in FIG. 9(b)] of each permanent magnet 104a on the center magnetic pole member 102 is preferably 5-50%, more preferably 10-25%, of the total thickness hm of the center magnetic pole member 102 and the permanent magnet 104a.

The permanent magnets 104a are arranged preferably on the center magnetic pole member 102 (on the target side), but they may be arranged under the center magnetic pole member 102 on the side of the non-magnetic base member 106, or the center magnetic pole member 102 may be horizontally divided to sandwich the permanent magnets 104a.

Figure 10A:
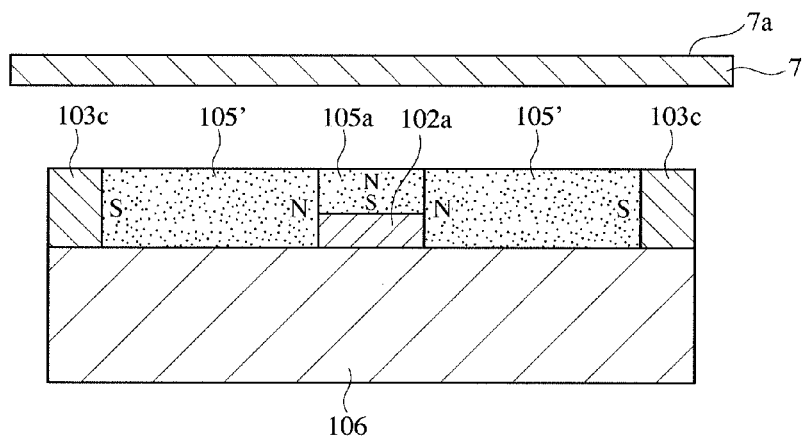
FIG. 10(a) is a cross-sectional view taken along the line J-J in FIG. 9(a).
Figure 10B:
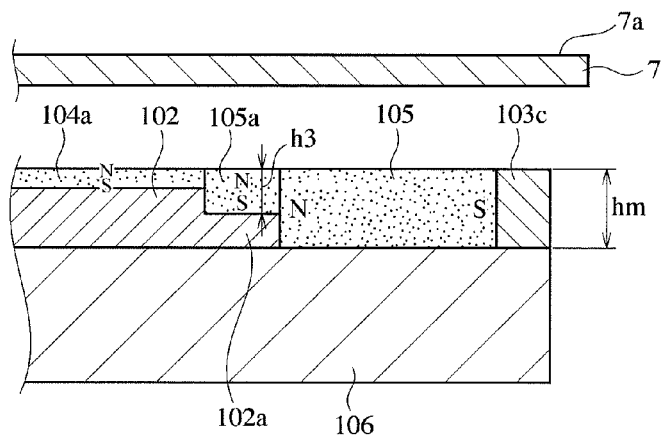
FIG. 10(b) is a cross-sectional view taken along the line K-K in FIG. 9(a).

In each corner portion 30, too, as shown in FIGS. 9(a), 10(a) and 10(b), permanent magnets 105a each having a magnetization direction perpendicular to the target surface 7a are arranged on the end portions 102a of the center magnetic pole member 102, such that their magnetic poles opposing the target surface 7a are the same as those of the permanent magnets 105 opposing the end portions 102a. As shown in FIGS. 10(a) and 10(b), the permanent magnets 105a in the corner portions 30 are preferably thicker than the permanent magnets 104 in the linear portion 20. The thickness of the permanent magnets 105a is preferably 1.2-3 times that of the permanent magnets 104.

Figure 11:
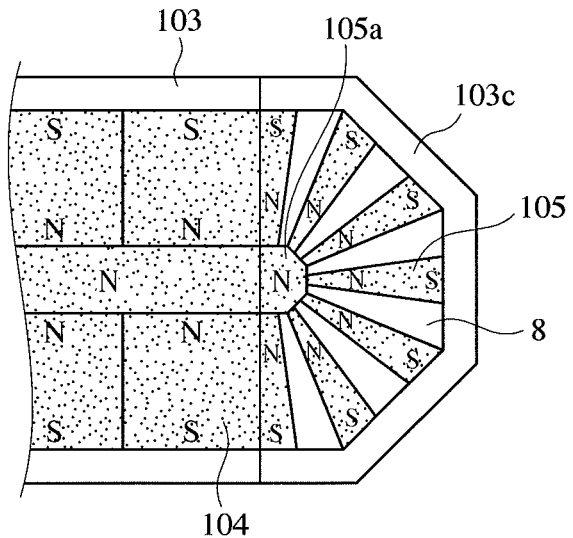
FIG. 11 is a partial plan view showing another example of corner portions in the second racetrack-shaped magnetic-field-generating apparatus of the present invention.
Figure 12:
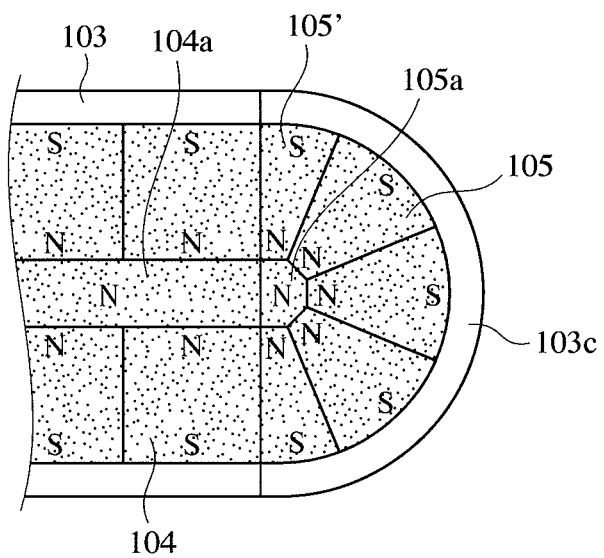
FIG. 12 is a partial plan view showing a further example of corner portions in the second racetrack-shaped magnetic-field-generating apparatus of the present invention.
Figure 13:
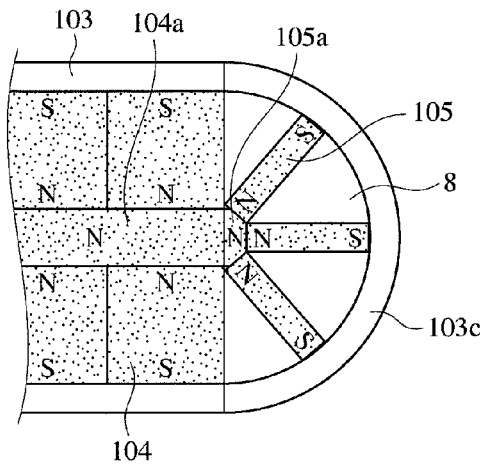
FIG. 13 is a partial plan view showing a still further example of corner portions in the second racetrack-shaped magnetic-field-generating apparatus of the present invention.

Each permanent magnet 105 in the corner portion 30 when viewed from above preferably has a trapezoidal shape in a case where the second peripheral magnetic pole portion 103c has a semi-polygonal shape as shown in FIG. 9(a) or 11, and a substantially fan shape in a case where the second peripheral magnetic pole portion 103c has a semicircular shape as shown in FIG. 12. As shown in FIG. 13, permanent magnets 105 in the corner portions 30 may be rectangular when viewed from above.

The permanent magnets 105 may completely fill a space between the end portion 102a and the second peripheral magnetic pole portion 103c as shown in FIG. 9(a), or there may be gaps 8 between adjacent permanent magnets 105 as shown in FIG. 11. A magnetic flux density on the target surface can be adjusted by the gaps 8. A ratio of the area of the permanent magnet 105 to the total area of a space between the end portion 102a of the center magnetic pole member 102 and the second peripheral magnetic pole portion 103c of the peripheral magnetic pole member 103 is preferably 30% or more.

The permanent magnet 105a arranged on the end portion 102a of the center magnetic pole member 102 preferably has the same shape as that of the end portion 102a to cover the end portion 102a completely. Though properly adjustable depending on a necessary magnetic field intensity and a magnet material, the thickness of each permanent magnet 105a in a magnetization direction is preferably equal to or larger than, more preferably 1.5-5 times, most preferably 2-3 times, that of each permanent magnet 104a.

Figure 14:
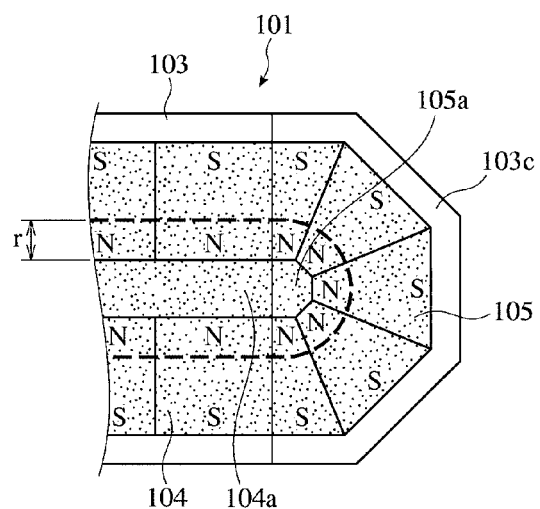
FIG. 14 is a partial schematic view showing a portion in which a magnetic field generated by the second racetrack-shaped magnetic-field-generating apparatus of the present invention has a magnetic flux density with no vertical component on a target surface.

As shown in FIG. 14, the permanent magnets 105a disposed on the end portions 102a of the center magnetic pole member 102 act to shift a portion in which a magnetic flux density has no vertical component (shown by a broken line in the figure) from the center magnetic pole member 102 to a position of a distance r (r<R), so that the deepest erosion portion is shifted to a center portion of the target. As a result, more uniform erosion proceeds on the target, resulting in improved use efficiency of the target. A horizontal component of a magnetic flux density on the target surface 7a in the portion in which a magnetic flux density has no vertical component is preferably 10 mT or more.

(2) Second Embodiment

Figure 15:
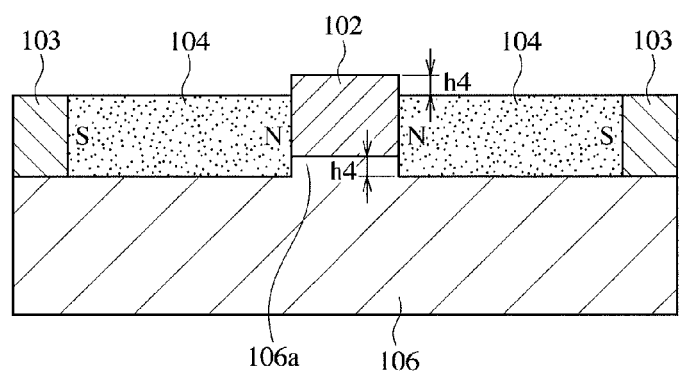
FIG. 15 is a transverse cross-sectional view showing the third racetrack-shaped magnetic-field-generating apparatus for magnetron sputtering according to the present invention.

As shown in FIG. 15, in the second magnetic-field-generating apparatus for magnetron sputtering according to the second embodiment, the center magnetic pole member 102 projects toward the target 7, so that the distance between the center magnetic pole member 102 and the target surface 7a is smaller than the distance between the peripheral magnetic pole member 103 and the target surface 7a. Other structures than this may be basically the same as in the first embodiment. With the projecting center magnetic pole member 102, a magnetic flux density is relatively high on the target surface 7a opposing the center magnetic pole member 102, resulting in a higher erosion speed in a center portion of the target, and thus higher use efficiency of the target.

In the second embodiment, the center magnetic pole member 102 can project toward the target 7, (a) by making the center magnetic pole member 102 thicker than the peripheral magnetic pole member 103, or (b) by making an upper surface of the non-magnetic base member 106 in contact with the center magnetic pole member 102 higher than the other portion. In the example shown in FIG. 15, a center upper surface portion 106a of the non-magnetic base member 106 is higher by h4, by which the upper surface of the center magnetic pole member 102 is higher than the peripheral magnetic pole member 103.

With the center magnetic pole member 102 formed by a material having higher permeability than that of the peripheral magnetic pole member 103, a magnetic flux density on the center magnetic pole member 102 can be made higher, resulting in a higher erosion speed in a center portion of the target. For example, the center magnetic pole member 102 is formed by a material having high permeability and high saturation magnetization such as permendur (Fe—Co—V), and the peripheral magnetic pole member 103 is formed by other stainless steels (SUS430, etc.) than austenitic stainless steel.

Pluralities of first and second magnetic-field-generating apparatuses of the present invention may be arranged in parallel with predetermined intervals, with each magnetic-field-generating apparatus swinging with substantially the same amplitude as the above interval, to form a thin film on a large substrate by using an integral target. Each of the first and second magnetic-field-generating apparatuses may be provided with a mechanism for adjusting the distance between the upper surface of the magnetic-field-generating apparatus and the target surface.

The present invention will be explained in more detail referring to Examples below without intention of restriction.

Example 1

Figure 7A:
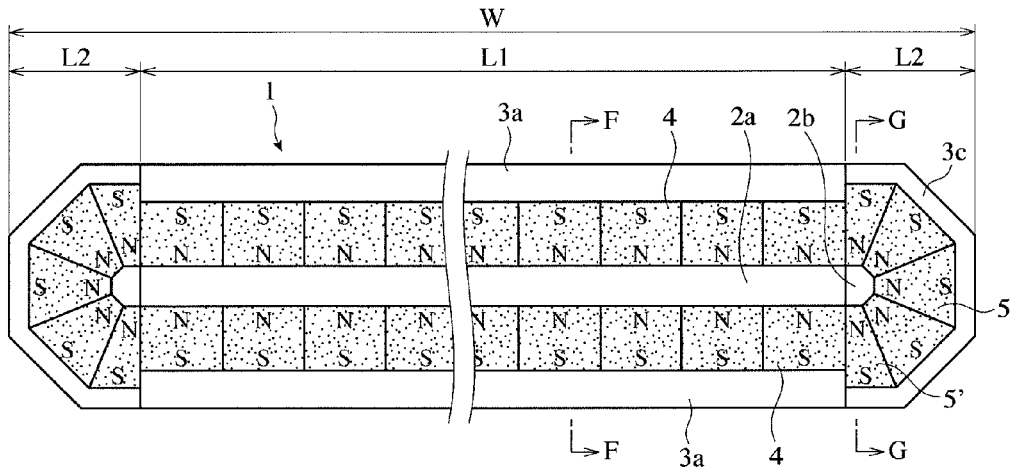
FIG. 7(a) is a plan view showing the racetrack-shaped magnetic-field-generating apparatus of Example 1.
Figure 7B:
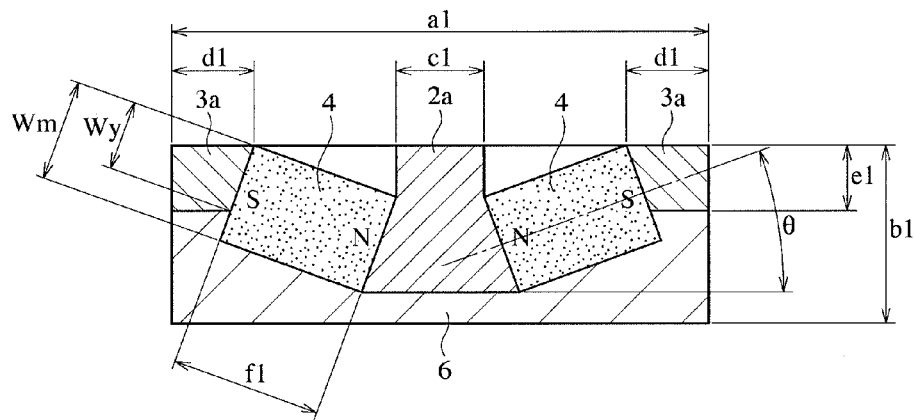
FIG. 7(b) is a cross-sectional view taken along the line F-F in FIG. 7(a).
Figure 7C:
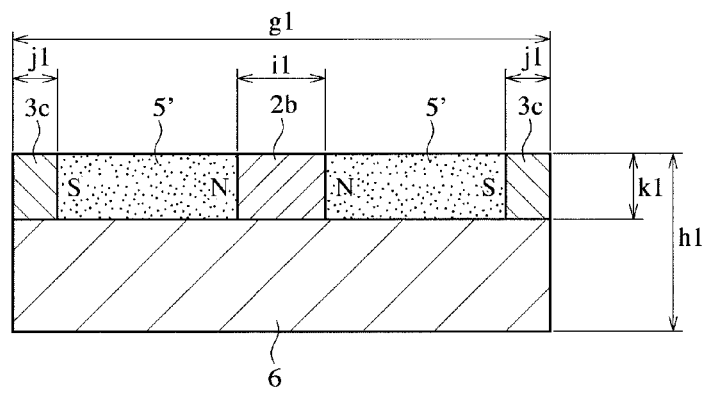
FIG. 7(c) is a cross-sectional view taken along the line G-G in FIG. 7(a).

As shown in FIGS. 7(a), 7(b) and 7(c), first and second center magnetic pole portions 2a, 2b of a center magnetic pole member 2 and first and second peripheral magnetic pole portions 3a, 3c of a peripheral magnetic pole member 3, which were formed by a steel plate (SS400), and permanent magnets 4 and 5 formed by an anisotropic sintered R-TM-B magnet (NMX50 available from Hitachi Metals, Inc., maximum energy product: 50 MGOe or more) were arranged on a non-magnetic base member 6 made of austenitic stainless steel (SUS304), to produce a magnetic-field-generating apparatus 1 (W=1000 mm, L1=700 mm, L2=150 mm, a1=100 mm, b1=50 mm, c1=10 mm, d1=15.5 mm, e1=9.8 mm, f1=30 mm, Wm=20 mm, Wy=10 mm, θ=10°, g1=100 mm, h1=50 mm, i1=10 mm, j1=5 mm, and k1=8 mm). With the inclination angle θ of the permanent magnets 4 in the linear portion 20 changed, a peak value of a horizontal component of a magnetic flux density, and a zero-crossing position (position at which a magnetic flux density had no vertical component) were determined by magnetic field analysis at a position 25 mm above a surface (opposing the target) of the magnetic-field-generating apparatus 1, which corresponded to a position of the target surface, and plotted relative to the inclination angle θ. The zero-crossing position is expressed by the distance r from the center magnetic pole member. The results are shown in FIG. 8.

Figure 8:
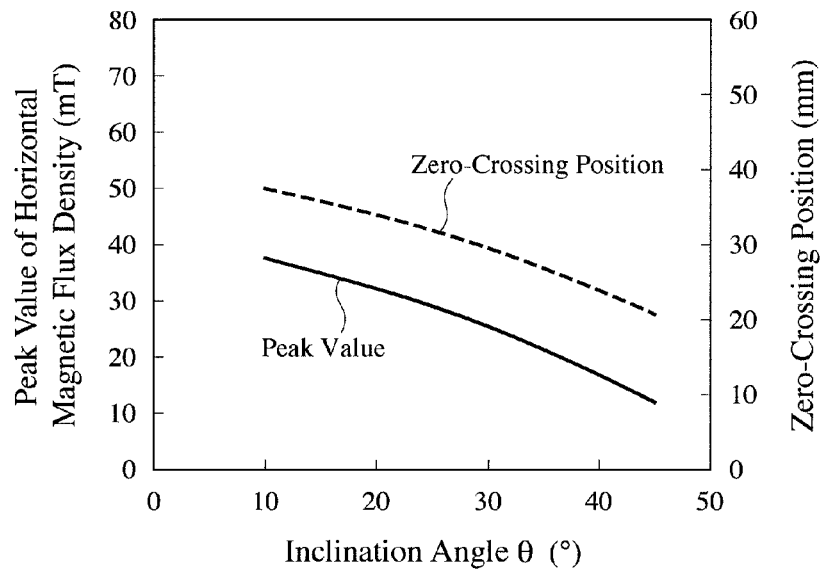
FIG. 8 is a graph showing the peak value and zero-crossing position of a horizontal component of a magnetic flux density (horizontal magnetic flux density) generated on a target surface by the racetrack-shaped magnetic-field-generating apparatus of Example 1.

As is clear from FIG. 8, increase in the inclination angle θ of the permanent magnets 4 in the linear portion 20 shifted the position at which a magnetic flux density had no vertical component, namely a position at which erosion proceeded fastest, toward the center magnetic pole member 2, and reduced the magnetic field intensity. Accordingly, with the inclination angle θ of the permanent magnets 4 in the linear portion 20 changed, the erosion region of the target can be expanded to make erosion more uniform, while adjusting the intensity of a magnetic field necessary for sputtering.

Example 2, and Comparative Example 1

Figure 16A:
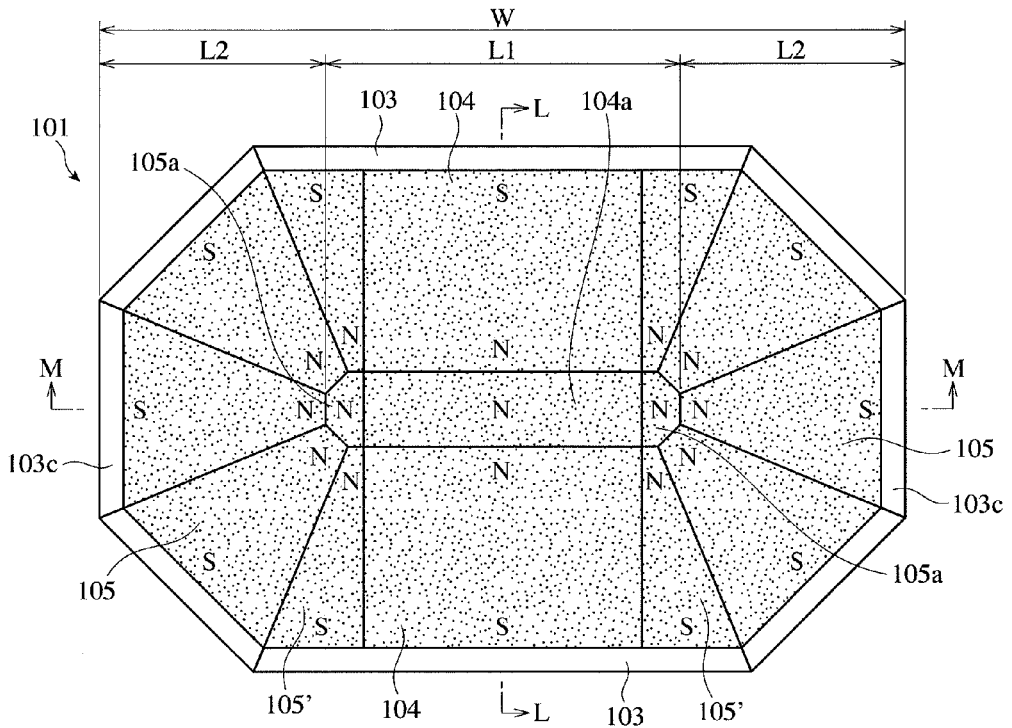
FIG. 16(a) is a plan view showing the racetrack-shaped magnetic-field-generating apparatus of Example 2.
Figure 16B:
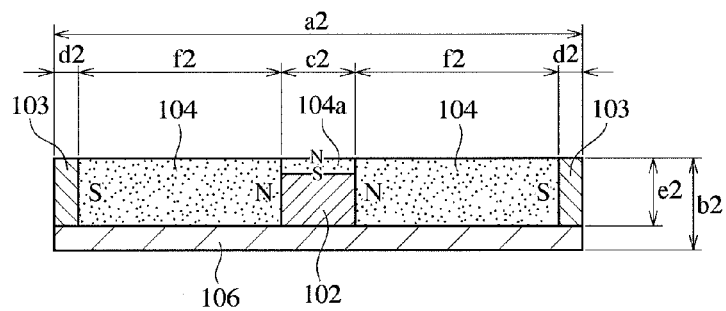
FIG. 16(b) is a cross-sectional view taken along the line L-L in FIG. 16(a).
Figure 16C:
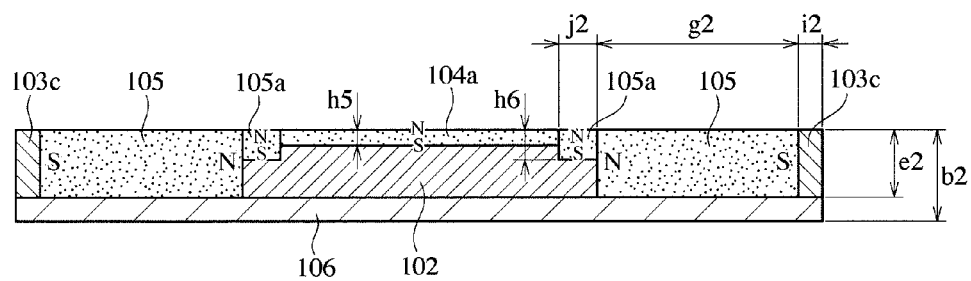
FIG. 16(c) is a cross-sectional view taken along the line M-M in FIG. 16(a).

A center magnetic pole member 102 and a peripheral magnetic pole member 103, which were formed by ferritic stainless steel (SUS430), and permanent magnets 104, 104a, 105 and 105a formed by a sintered ferrite magnet (NMF-3B available from Hitachi Metals, Inc., maximum energy product: about 4 MGOe) were arranged on a non-magnetic base member 106 made of an Al—Mg alloy (A5052), to produce a magnetic-field-generating apparatus 101 (W=300 mm, L1=150 mm, L2=75 mm, a2=160 mm, b2=40 mm, c2=30 mm, d2=10 mm, e2=35 mm, f2=55 mm, g2=65 mm, h5=5 mm, h6=10 mm, i2=10 mm, and j2=15 mm) shown in FIGS. 16(a), 16(b) and 16(c).

Figure 17:
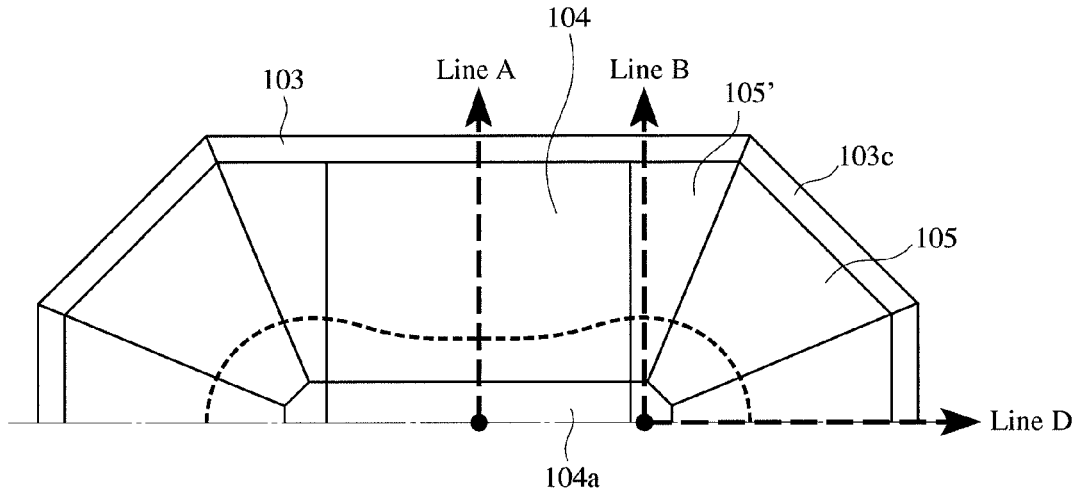
FIG. 17 is a partial schematic view with lines A, B and D showing a portion in which a magnetic field generated by the racetrack-shaped magnetic-field-generating apparatus of Example 2 has a magnetic flux density with no vertical component on a target surface.
Figure 18:
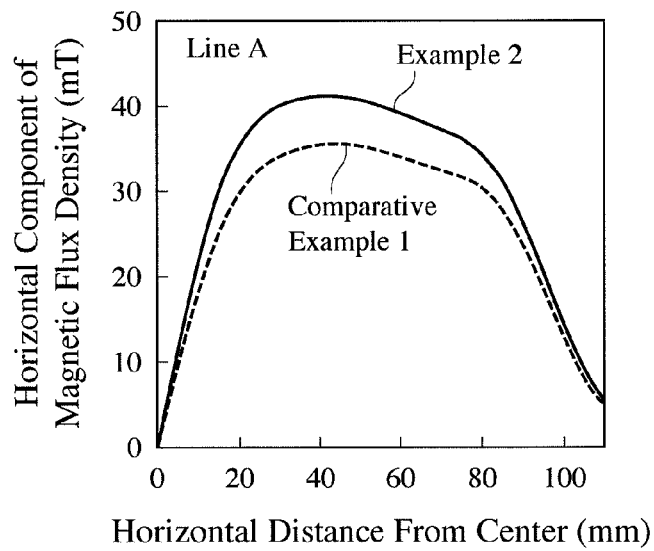
FIG. 18 is a graph showing horizontal components of magnetic flux densities generated on a target surface by the racetrack-shaped magnetic-field-generating apparatuses of Example 2 and Comparative the Example 1, which are plotted along the line A.
Figure 19:
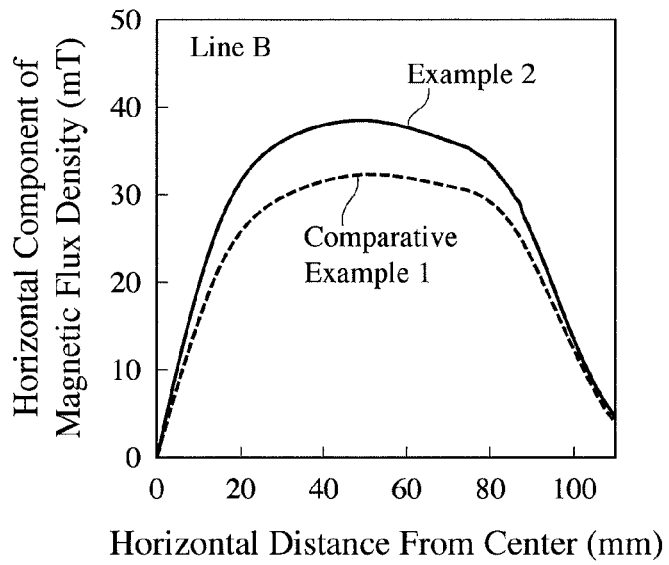
FIG. 19 is a graph showing horizontal components of magnetic flux densities generated on a target surface by the magnetic-field-generating apparatuses of Example 2 and Comparative Example 1, which are plotted along the line B.

A magnetic flux density at a position 25 mm above a surface (opposing the target) of the magnetic-field-generating apparatus 101, which corresponded to a position of the target surface, was determined by magnetic field analysis, and its horizontal component was plotted along the lines A and B (FIG. 17) in FIGS. 18 and 19, respectively. With respect to the magnetic-field-generating apparatus of Comparative Example 1 having the same structure as in Example 2 except for having no permanent magnets 104a and 105a, a magnetic flux density was determined, and its horizontal component was plotted along the lines A and B in FIGS. 18 and 19.

As is clear from FIGS. 18 and 19, with the permanent magnets 104a arranged on the center magnetic pole member 102 and the permanent magnets 105a arranged on the end portions of the center magnetic pole member 102, a magnetic field was steeply increased in a center portion of the target. A position at which the horizontal component of a magnetic flux density was 32 mT changed from 30 mm to 19 mm in the line A, and from 44 mm to 24 mm in the line B. The zero-crossing position, at which a magnetic flux density has no vertical component, in this case is shown by a dotted line in FIG. 17. These results have revealed that in the second magnetic-field-generating apparatus, the erosion region of a target is expanded toward the center magnetic pole member 102 to make the erosion of the target more uniform.

Figure 20:
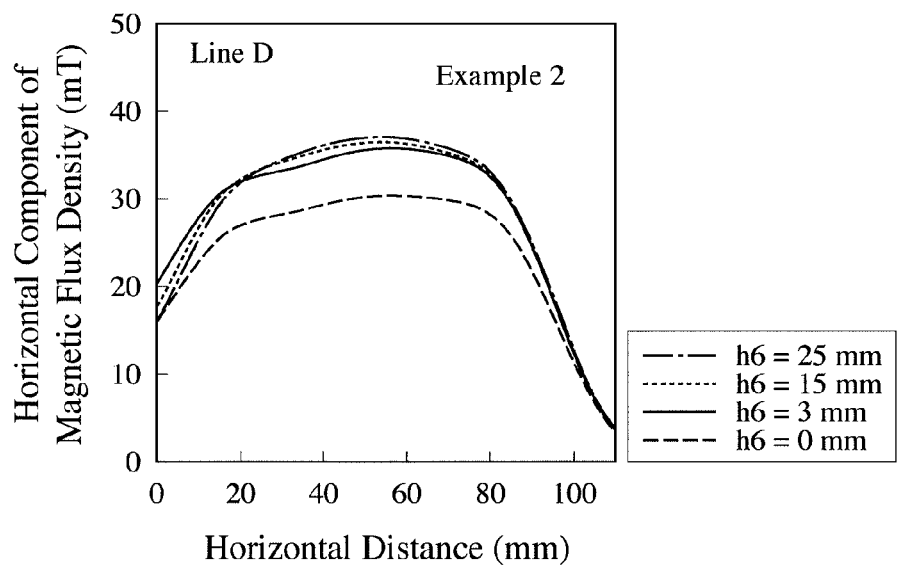
FIG. 20 is a graph showing a horizontal component of a magnetic flux density generated on a target surface by the magnetic-field-generating apparatus of Example 2, which is plotted along the line D.
Figure 21:
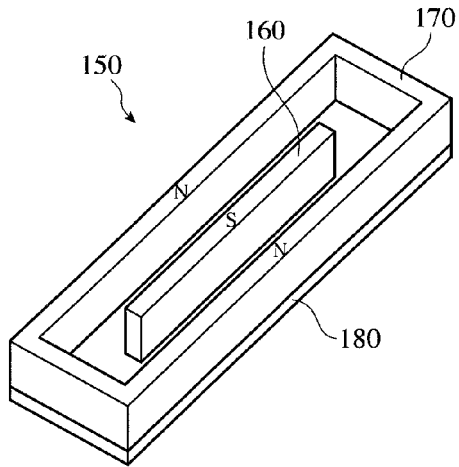
FIG. 21 is a perspective view showing an example of conventional magnetic-field-generating apparatuses for magnetron sputtering.
Figure 22:
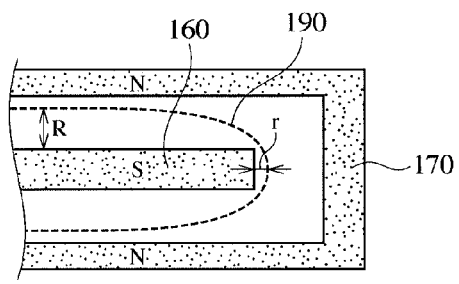
FIG. 22 is a partial schematic view showing a portion in which a magnetic field generated by the conventional magnetic-field-generating apparatus for magnetron sputtering shown in FIG. 21 has a magnetic flux density with no vertical component on a target surface.
Figure 23A:
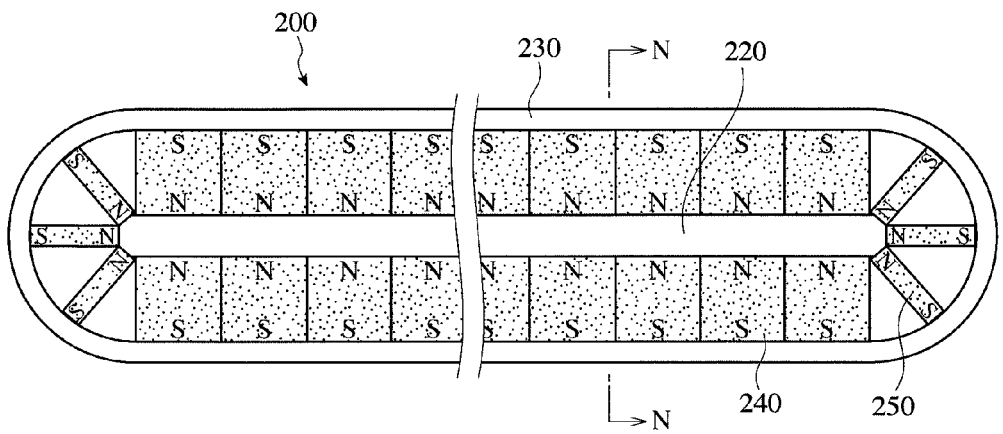
FIG. 23(a) is a plan view showing another example of conventional magnetic-field-generating apparatuses for magnetron sputtering.
Figure 23B:
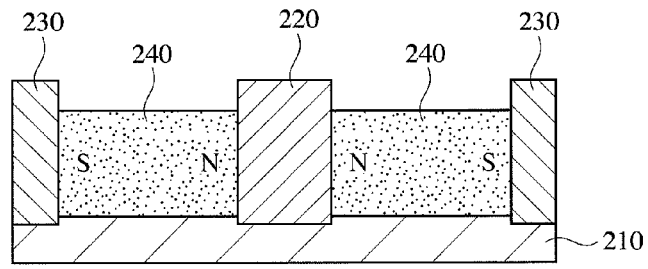
FIG. 23(b) is a cross-sectional view taken along the line N-N in FIG. 23(a).
Figure 24:
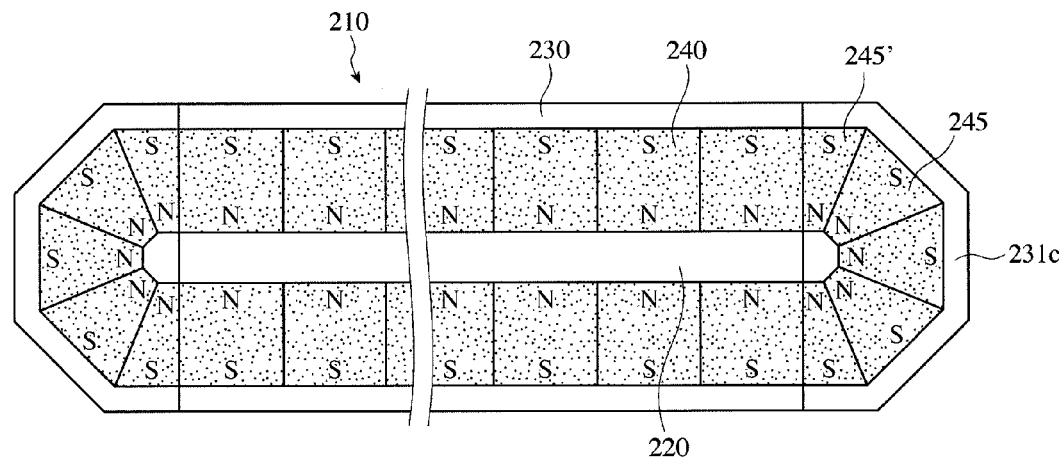
FIG. 24 is a plan view showing a further example of conventional magnetic-field-generating apparatuses for magnetron sputtering.

Further, with the permanent magnets 104a having a thickness h5 of 3 mm arranged on the center magnetic pole member 102, and the permanent magnets 105a having four different thicknesses h6 of 0 mm, 3 mm, 15 mm and 25 mm arranged on the end portions of the center magnetic pole member 102, a horizontal component of a magnetic flux density in each of the resultant magnetic-field-generating apparatuses was determined by the same magnetic field analysis and plotted along the line D (FIG. 17) in FIG. 20. As a result, it was found that when the permanent magnets 105a on the end portions of the center magnetic pole member 102 had a thickness h6 of 3 mm, a magnetic field increased most steeply in a center portion of the target.

Effects of the Invention

Because a portion in which a magnetic flux density has no vertical component (the deepest erosion portion) is shifted toward a center portion of the racetrack-shaped magnetic-field-generating apparatus of the present invention for magnetron sputtering, erosion increases in a center portion of the target, resulting in more uniform erosion of the target, and thus improved use efficiency of the target.

Because the intensity of a magnetic field necessary for sputtering can be adjusted by changing the inclination angle of the magnetization directions of permanent magnets in the first magnetic-field-generating apparatus of the present invention, optimum conditions for various target materials can be achieved with one magnetic-field-generating apparatus. Also, abnormal discharge during sputtering can be coped with by local change of the inclination angle.

In the second magnetic-field-generating apparatus, optimum conditions for various target materials can be achieved by adjusting the magnetization and size of the second permanent magnets. Further, in the third magnetic-field-generating apparatus, optimum conditions for various target materials can be achieved by changing the positions of the upper surfaces of the center magnetic pole member and the peripheral magnetic pole member.

What is claimed is:

1. A racetrack-shaped magnetic-field-generating apparatus for generating a magnetic field on a target surface for magnetron sputtering, comprising
    a center magnetic pole member comprising a soft-magnetic material;
    a peripheral magnetic pole member surrounding said center magnetic pole member;
    pluralities of permanent magnets arranged between said center magnetic pole member and said peripheral magnetic pole member with one magnetic pole opposing said center magnetic pole member and the other magnetic pole opposing said peripheral magnetic pole member; and
    a non-magnetic base member supporting said center magnetic pole member, said peripheral magnetic pole member and said permanent magnets;
    said racetrack shape having a linear portion and corner portions;
    each permanent magnet arranged at least in said linear portion having a magnetic pole surface opposing said center magnetic pole member, which has a magnetization direction inclined away from said target;
    each permanent magnet arranged at least in said linear portion having a magnetic pole surface opposing said peripheral magnetic pole member, which has a portion not in contact with said peripheral magnetic pole member on a closer side to said base member; and
    the distance between said center magnetic pole member and said target being the same as the distance between said peripheral magnetic pole member and said target, wherein the inclination angle of said permanent magnets arranged in said linear portion is 5-45° relative to said target and is stationary.

2. The racetrack-shaped magnetic-field-generating apparatus according to claim 1, wherein pluralities of permanent magnets arranged in said linear portion are constituted by at least two groups of permanent magnets having different inclination angles.

3. The racetrack-shaped magnetic-field-generating apparatus according to claim 1, wherein said permanent magnets arranged in said corner portions are magnetized in parallel to said target.

4. The racetrack-shaped magnetic-field-generating apparatus according to claim 1 wherein each permanent magnet arranged in said corner portions has a magnetic pole surface opposing said center magnetic pole member, which has a magnetization direction inclined away from said target; and wherein each permanent magnet arranged in said corner portions has a magnetic pole surface opposing said peripheral magnetic pole member, which has a portion not in contact with said peripheral magnetic pole member on a closer side to said base member.

5. The racetrack-shaped magnetic-field-generating apparatus for magnetron sputtering according to claim 1, wherein the surfaces of said center magnetic pole member and said peripheral magnetic pole member, which are opposing said target, are in parallel to said target.

6. A racetrack-shaped magnetic-field-generating apparatus for generating a magnetic field on a target surface for magnetron sputtering, comprising
    a center magnetic pole member;
    a peripheral magnetic pole member surrounding said center magnetic pole member;
    pluralities of first permanent magnets each having a magnetization direction in parallel to the target surface, and each arranged between said center magnetic pole member and said peripheral magnetic pole member with one magnetic pole opposing said center magnetic pole member and the other magnetic pole opposing said peripheral magnetic pole member, and each arranged in contact with said center magnetic pole member and said peripheral magnetic pole member; and
    a non-magnetic base member supporting said center magnetic pole member, said peripheral magnetic pole member and said permanent magnets;
    second permanent magnets each having a magnetization direction perpendicular to said target surface being arranged on said center magnetic pole member and being arranged between the target surface and said center magnetic pole member, such that their magnetic poles opposing said target surface are the same as those of said first permanent magnets opposing said center magnetic pole member.

7. The racetrack-shaped magnetic-field-generating apparatus for magnetron sputtering according to claim 6, wherein said center magnetic pole member extends in said racetrack-shaped linear portion and said corner portions; and wherein among said second permanent magnets arranged on said center magnetic pole member, those in said linear portion are thinner than those in both end portions of said center magnetic pole member.

8. A racetrack-shaped magnetic-field-generating apparatus for generating a magnetic field on a target surface for magnetron sputtering, comprising
    a center magnetic pole member;
    a peripheral magnetic pole member surrounding said center magnetic pole member;
    pluralities of permanent magnets each having a magnetization direction in parallel to said target surface, and each arranged between said center magnetic pole member and said peripheral magnetic pole member with one magnetic pole opposing said center magnetic pole member and the other magnetic pole opposing said peripheral magnetic pole member, and each arranged in contact with said center magnetic pole member and said peripheral magnetic pole member; and a non-magnetic base member supporting said center magnetic pole member, said peripheral magnetic pole member and said permanent magnets;

the distance between said center magnetic pole member and said target surface being smaller than the distance between said peripheral magnetic pole member and said target surface.

* * * * *